(12) United States Patent
Noguchi

(10) Patent No.: US 6,380,827 B1
(45) Date of Patent: Apr. 30, 2002

(54) SURFACE ACOUSTIC WAVE FILTER AND BRANCHING FILTER UTILIZING IT

(75) Inventor: Kazushige Noguchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/589,360

(22) Filed: Jun. 8, 2000

(30) Foreign Application Priority Data

Jun. 8, 1999 (JP) .......................................... 11-160636

(51) Int. Cl.$^7$ ................................................ H03H 9/64
(52) U.S. Cl. ...................... 333/193; 333/133; 333/195; 310/313 R; 310/313 B
(58) Field of Search ................................. 333/133, 193, 333/195; 310/313 R, 313 B

(56) References Cited

U.S. PATENT DOCUMENTS

| | | | | |
|---|---|---|---|---|
| 5,592,135 A | * | 1/1997 | Taguchi et al. | 333/193 |
| 5,717,367 A | * | 2/1998 | Murai | 333/195 |
| 5,864,262 A | * | 1/1999 | Ikada | 333/193 |
| 5,874,869 A | * | 2/1999 | Ueda et al. | 333/193 |

FOREIGN PATENT DOCUMENTS

| JP | 9-186553 A | * | 7/1997 | ............ H03H/9/64 |
|---|---|---|---|---|
| JP | 10-256869 | | 9/1998 | ............ H03H/9/25 |

* cited by examiner

*Primary Examiner*—Robert Pascal
*Assistant Examiner*—Dean Takaoka
(74) *Attorney, Agent, or Firm*—Venable; Robert J. Frank; Michael A. Sartori

(57) ABSTRACT

Disclosed is a surface acoustic wave filter having a first serial-arm SAW resonator coupled to an input terminal and a first dual-mode SAW resonator coupled between the first serial-arm SAW resonator and an output terminal, wherein the first dual-mode SAW resonator includes first to third comb-shaped interdigital transducers, the second comb-shaped interdigital transducer is arranged between the first and third comb-shaped interdigital transducers and also coupled between the first serial-arm SAW resonator and the ground potential, and each of the first and third comb-shaped interdigital transducers is coupled between the ground potential and the output terminal. Also disclosed is a branching filter utilizing the surface acoustic wave filter.

20 Claims, 9 Drawing Sheets

SURFACE ACOUSTIC WAVE FILTER AND BRANCHING FILTER UTILIZING IT

BACKGROUND OF THE INVENTION (i) Field of the Invention

The present invention relates to a surface acoustic wave filter (hereinbelow, referred to as an SAW filter) for use in a radio frequency unit of mobile communication equipment, particularly, a portable telephone and relates to a branching filter comprising the filter. This application is a counterpart application of Japanese Application Serial Number 160636/1999, filed Jun. 8, 1999, the subject matter of which is incorporated herein by reference.

(ii) Description of the Related Art

Hitherto, as an art regarding an SAW filter, for example, there is one disclosed in "Structure of transmitting SAW filter for branching filter" of Japanese Patent Application Laid-Open No. 10-256869 (1998). FIG. 8 shows the structure of a branching filter comprising conventional SAW filters. As shown in FIG. 8, the branching filter comprising the SAW filters is constructed as described hereinbelow. An antenna-side matching circuit 7 is coupled to an antenna terminal 1 and an earth terminal 2. Between a transmitting terminal 3, an earth terminal 4, and the antenna-side matching circuit 7, a transmission-side branching circuit 8, a transmission-side SAW resonator type filter 9, and a transmission-side matching circuit 10 are coupled. On the other hand, between a receiving terminal 5, an earth terminal 6, and the antenna-side matching circuit 7, a reception-side branching circuit 11, a reception-side SAW resonator type filter 12, and a reception-side matching circuit 13 are coupled.

FIG. 9 shows the construction of a radio frequency unit (RF unit) including a branching filter constructed by using general SAW resonators. As shown in FIG. 9, a branching filter 15 is coupled to an antenna 14. An amplifier 16 and a reception-side SAW filter 17 are coupled to the reception side of the branching filter 15. A power amplifier 18 and a transmission-side SAW filter 19 are coupled to the transmission side of the branching filter 15.

In this instance, FIG. 10 shows the structure of the reception-side SAW resonator type filter 12 as an example. The reception-side SAW filter 12 shown in FIG. 10 has a ladder-shaped six-stage structure using SAW resonators. Between an input terminal 21 and an output terminal 22, a first serial-arm SAW resonator 23, a second serial-arm SAW resonator 24, and a third serial-arm SAW resonator 25 are coupled. Between the input terminal 21 and the ground potential, a first parallel-arm SAW resonator 26 is coupled. Between the ground potential and node between the first and second serial-arm SAW resonators 23 and 24, a second parallel-arm SAW resonator 27 is coupled. Between the ground potential and node between the second and third serial-arm SAW resonators 24 and 25, a third parallel-arm SAW resonator 28 is coupled. Between the output terminal 22 and the ground potential, a fourth parallel-arm SAW resonator 29 is coupled.

As kinds of the branching filters, two kinds of branching filters, namely, a branching filter comprising dielectric filters for use in a communication terminal such as a portable telephone and an SAW branching filter for use in a card terminal can be mainly mentioned so far. Since a demand for miniaturization of a communication terminal device itself is increased in association with the spread of communication terminals such as portable telephones in recent years, a demand for miniaturization of high frequency parts built in the communication terminal device is also increased. Consequently, the SAW branching filter is used in place of the dielectric filer also in the communication terminal such as a portable telephone. Requested standards for the SAW branching filter as a device come to be equivalent to those for the branching filter comprising the dielectric filters.

When the SAW branching filter is used in the communication terminal such as a portable telephone, as compared with the case where it is used in the card terminal, the electric power resistance of comb teeth electrodes of the SAW filter in the SAW branching filter is regarded as important. It is strongly desired that the SAW branching filter satisfies standards regarding an amount of attenuation in the communication terminal such as a portable telephone. Further, the above-mentioned electric power resistance of the SAW branching filter is obtained, and on the other hand, it is desired that an amount of attenuation in the vicinity of a frequency pass band regarding the reception-side SAW filter, namely, in a frequency pass band regarding the transmission-side SAW filter is obtained as much as possible while realizing the miniaturization of the chip size of the SAW filter. Also in the SAW branching filter using a cascade-connecting dual-mode SAW filter, while the electric power resistance of comb teeth electrodes is obtained, and on the other hand, it is desired that an amount of attenuation in the vicinity of the frequency pass band regarding the reception-side SAW filter, namely, in the frequency pass band regarding the transmission-side SAW filter is obtained as much as possible while realizing the miniaturization of the chip size of the SAW filter.

SUMMARY OF THE INVENTION

According to the present invention, it is an object to provide an SAW filer in which while realizing the miniaturization of the chip size of a SAW filter, the electric power resistance of comb teeth electrodes in the SAW filter can be obtained, and an amount of attenuation in the vicinity of a frequency pass band regarding one SAW filter, namely, in a frequency pass band regarding the invention other SAW filter can be obtained as much as possible and provide a branching filter utilizing it.

To accomplish the above object, according to the present invention, there is provided an SAW filter comprising: a first serial-arm SAW resonator coupled to an input terminal; and a first dual-mode SAW resonator coupled between the first serial-arm SAW resonator and an output terminal, wherein the first dual-mode SAW resonator includes first to third comb-shaped interdigital transducers, the second comb-shaped interdigital transducer is arranged between the first and third interdigital transducers and also coupled between the first serial-arm SAW resonator and the ground potential, and each of the first and third comb-shaped interdigital transducers is coupled between the ground potential and the output terminal.

To accomplish the above object, according to the present invention, there is provided an SAW branching filter comprising: a reception-side surface acoustic wave filter which is coupled between an antenna terminal and an amplifier; and a transmission-side surface acoustic wave filter which is coupled between the antenna terminal and a power amplifier, wherein an input terminal of the reception-side surface acoustic wave filter is coupled to the antenna terminal and an output terminal (of the reception-side surface acoustic wave filter) is coupled to the amplifier, the reception-side surface acoustic wave filter has a first serial-arm SAW resonator coupled to the input terminal and a first dual-mode SAW resonator coupled between the first serial-arm SAW resonator and the output terminal, the first dual-mode SAW resonator includes first to third comb-shaped interdigital transducers, the second comb-shaped interdigital transducer is arranged between the first and third comb-shaped interdigital transducers and also coupled between the first serial-arm SAW resonator and the ground potential, and each of the first and third comb-shaped interdigital transducers is coupled between the ground potential and the output terminal.

DETAILED DESCRIPTION OF THE PREFERRED EMBODIMENTS

Embodiments of the present invention will now be described hereinbelow with reference to the drawings.

Figure 1:
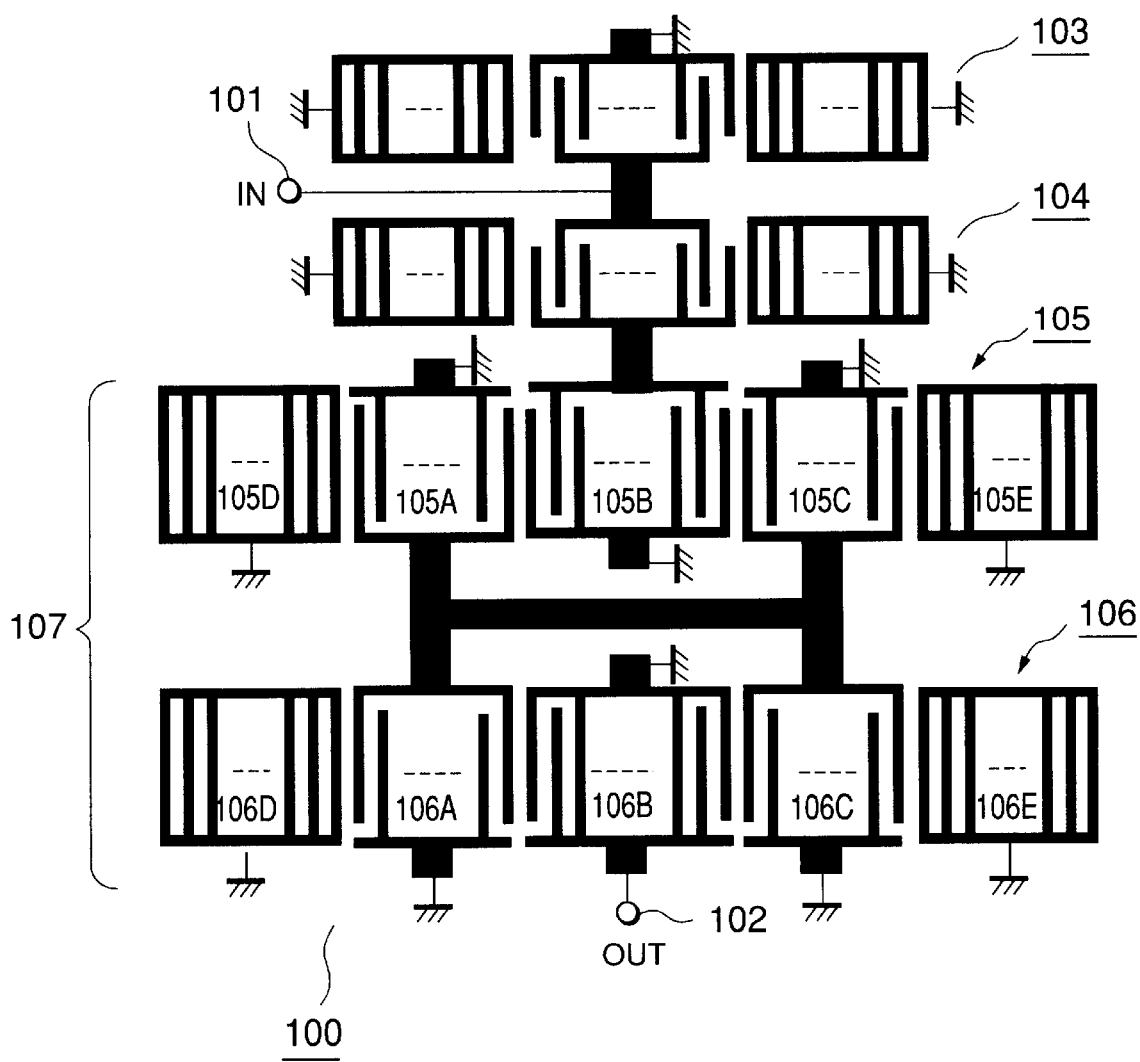
FIG. 1 is a diagram showing the construction of an SAW filter in a first embodiment of the present invention.

FIG. 1 is a diagram showing the construction of a reception-side SAW filter 100 in an SAW branching filter according to a first embodiment of the present invention. As shown in FIG. 1, between an input terminal 101 and an output terminal 102, a serial-arm SAW resonator 104 and a two-stage cascade-connecting dual-mode SAW filter 107 are coupled. Between the input terminal 101 and a ground potential $V_{SS}$, a parallel-arm SAW resonator 103 is coupled.

The structure of the two-stage cascade-connecting dual-mode SAW filter 107 will now be described. The cascade-connecting dual-mode SAW filter 107 is constructed by cascading two dual-mode SAW filters 105 and 106. The dual-mode SAW filter 105 is constituted of three comb-shaped interdigital transducers (hereinbelow, abbreviated to IDTs) 105A to 105C and reflectors 105D and 105E. The IDT 105B is arranged between the IDTs 105A and 105C. One comb-shaped electrode of the IDT 105B is coupled to the serial-arm SAW resonator 104 and the other comb-shaped electrode of the IDT 105B is coupled to the ground potential $V_{SS}$. One electrode of each of the IDTs 105A and 105C is coupled to the ground potential $V_{SS}$. The other electrodes of the IDTs 105A and 105C are coupled to each other and also coupled to the dual-mode SAW filter 106. The dual-mode SAW filter 106 is also constituted of three IDTs 106A to 106C and reflectors 106D and 106E. The IDT 106B is arranged between the IDTs 106A and 106C. One comb-shaped electrode of the IDT 106B is coupled to the ground potential $V_{SS}$ and the other one of the IDT 106B is coupled to the output terminal 102. One electrode of each of the IDTs 106A and 106C is coupled to the ground potential $V_{SS}$. The other electrodes of the IDTs 106A and 106C are coupled to each other and also coupled to the dual-mode SAW filter 105.

Figure 9:
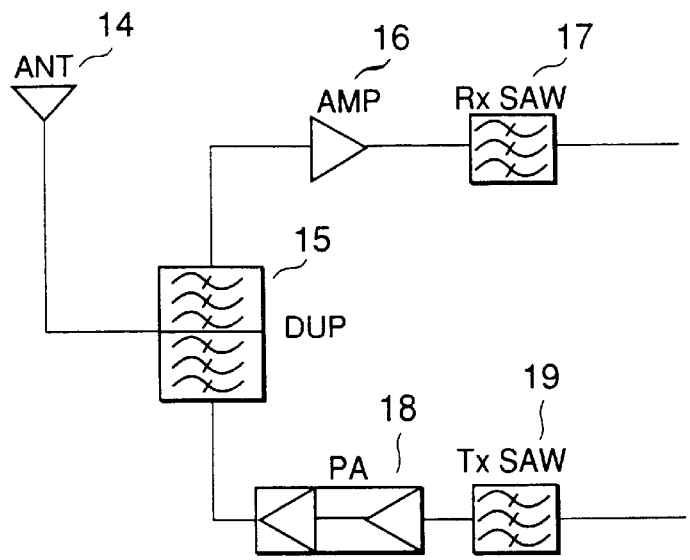
FIG. 9 is a diagram showing the construction of a radio frequency unit including a branching filter comprising general SAW resonators.
Figure 10:
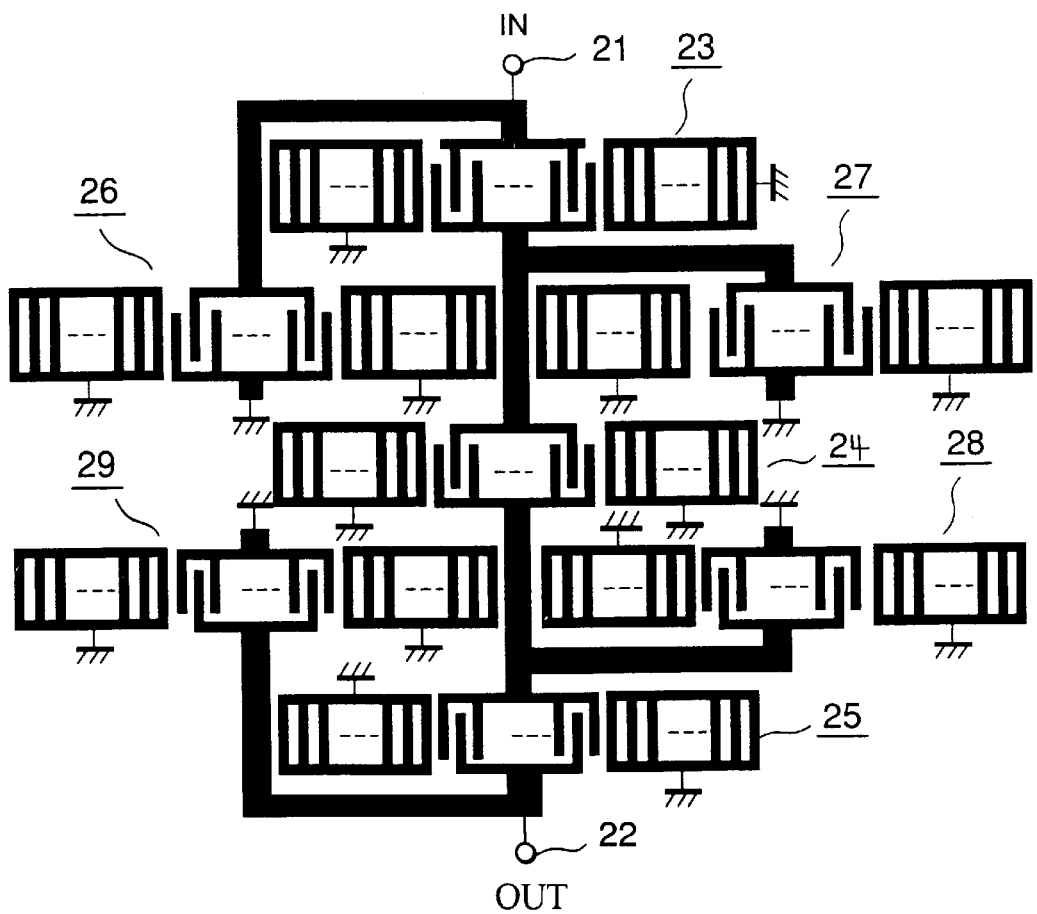
FIG. 10 is a diagram showing the construction of a conventional reception-side SAW resonator type filter.

The reception-side SAW filter 100 constructed as mentioned above is built in the branching filter 15 that is used for the radio frequency unit (RF unit) of the communication terminal as shown in FIG. 9. In other words, the input terminal 101 of the reception-side SAW filter 100 is coupled to the antenna side and the output terminal 102 is coupled to the amplifier 16 side. The flow of transmission/reception signals in the communication terminal in which the branching filter 15 comprising the reception-side SAW filter 100 constructed as mentioned above is built will now be described hereinbelow. First, the flow of the reception signal in the radio frequency unit of the communication terminal will now be explained. A radio wave signal received by the antenna 14 is branched by the branching filter 15. After that, the branched signal is amplified by the amplifier 16 on the reception side and transmitted to the reception-side SAW filter 17. The flow of the transmission signal in the radio frequency unit of the communication terminal will now be described. The transmission signal from the transmission-side SAW filter 19 is amplified by the power amplifier 18 and, after that, the amplified signal is transmitted as a radio wave signal from the antenna 14 via the branching filter 15.

In this instance, we now pay attention to the branching filter 15. When the communication terminal transmits the transmission signal as a radio wave signal, the amplified transmission signal is generated from the power amplifier 18. Therefore, a large electric power is applied to the branching filter 15. At that time, since the amplified transmission signal is directed to the reception-side SAW filter 100, the large electric power is also applied to the reception-side SAW filter 100 in the branching filter 15 through the input terminal 101 of the reception-side SAW filter 100.

In the input terminal 101 of the reception-side SAW filter 100 according to the first embodiment of the present invention, however, in order to favorably maintain the electric power resistance of the reception-side SAW filter 100, the parallel-arm SAW resonator 103 and the serial-arm SAW resonator 104 are coupled in a ladder form. Therefore, even if the amplified transmission signal from the power amplifier 18 is directed and inputted to the reception-side SAW filter 100, the destruction of the comb-shaped electrodes in the reception-side SAW filter 100 can be suppressed. Since the cascade-connecting dual-mode SAW filter 107 in which the dual-mode SAW filters 105 and 106 are cascaded is coupled to the output terminal 102 of the reception-side SAW filter 100, it is possible to increase an amount of attenuation in the vicinity of a frequency pass band regarding the reception-side SAW filter 100 in the branching filter 15, namely, in the frequency pass band regarding the transmission-side SAW filter in the branching filter 15. In the reception-side SAW filter 100 having the above-mentioned construction, since the number of IDTs is smaller than that of a conventional SAW filter, a degree of freedom regarding the pattern design of comb teeth electrodes can be improved and the miniaturization of the branching filter can be also realized, so that the manufacturing cost of the branching filter can be suppressed.

The SAW filter 100 having the construction shown in FIG. 1 can be used as a transmission-side SAW filter in the branching filter 15 shown in FIG. 9. That is, the input terminal 101 is coupled to the power amplifier 18 and used as an input terminal for the transmission signal amplified by the power amplifier 18. The output terminal 102 is coupled to the antenna side and used as an output terminal of the amplified transmission signal.

When the transmission signal amplified by the power amplifier 18 is inputted to the branching filter 15, a large electric power is applied to the branching filter 15. However, since the first stage of the transmission-side SAW filter, to which the amplified transmission signal is inputted, is constructed by the parallel-arm SAW resonator 103 and the serial-arm SAW resonator 104 which are coupled in a ladder form, even if an electric power caused by the amplified transmission signal is applied to the transmission-side SAW filter, the destruction of the comb-shaped electrodes in the transmission-side SAW filter can be suppressed. Since the cascade-connecting dual-mode SAW filter 107 in which the dual-mode SAW filters 105 and 106 are cascaded is coupled on the output side of the transmission-side SAW filter, it is possible to increase an amount of attenuation in the vicinity of a frequency pass band regarding the transmission-side SAW filter in the branching filter 15, namely, in a frequency pass band regarding the reception-side SAW filter in the branching filter 15.

Figure 2:
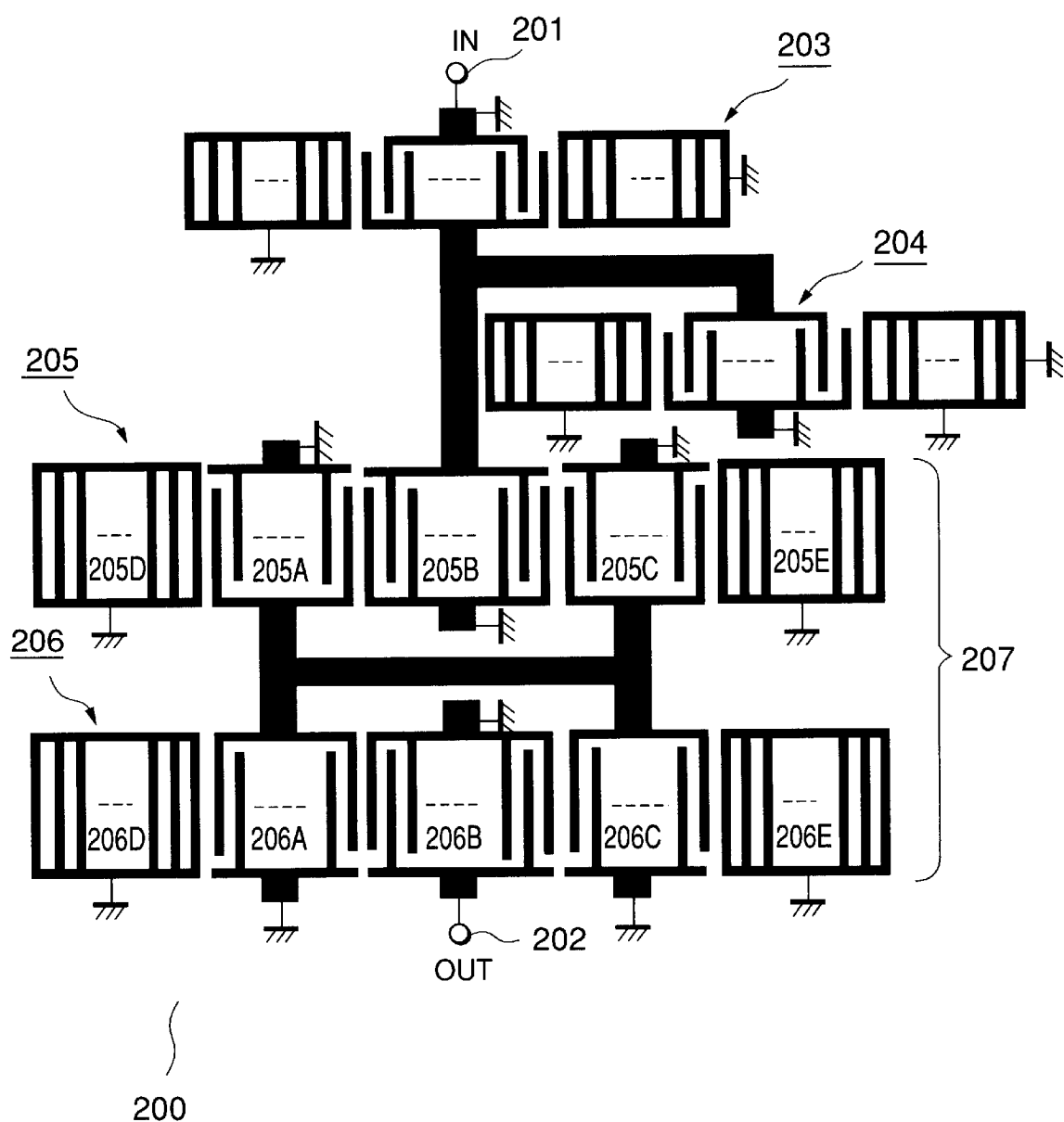
FIG. 2 is a diagram showing the construction of an SAW filter in a second embodiment of the present invention.

A reception-side SAW filter 200 according to a second embodiment of the present invention will now be described with reference to FIG. 2. As shown in FIG. 2, between an input terminal 201 and an output terminal 202, a serial-arm SAW resonator 203 and a two-stage cascade-connecting dual-mode SAW filter 207 are coupled. Between the ground potential $V_{SS}$ and node between the serial-arm SAW resonator 203 and the cascade-connecting dual-mode SAW filter 207, a parallel-arm SAW resonator 204 is coupled. The cascade-connecting dual-mode SAW filter 207 is constructed by cascading two dual-mode SAW filters 205 and 206. The dual-mode SAW filter 205 comprises three IDTs 205A to 205C and two reflectors 205D and 205E. The IDT 205B is arranged between the IDTs 205A and 205C. One comb-shaped electrode of the IDT 205B is coupled to the serial-arm SAW resonator 203 and the parallel-arm SAW resonator 204. The other comb-shaped electrode of the IDT 205B is coupled to the ground potential $V_{SS}$. One electrode of each of the IDTs 205A and 205C is connected to the ground potential $V_{SS}$. The other electrodes of the IDTs 205A and 205C are coupled to each other and also coupled to the dual-mode SAW filter 206. The dual-mode SAW filter 206 also comprises three IDTs 206A to 206C and two reflectors 206D and 206E. The IDT 206B is arranged between the IDTs 206A and 206C. One comb-shaped electrode of the IDT 206B is coupled to the ground potential $V_{SS}$ and the other one of the IDT 206B is coupled to the output terminal 202. One electrode of each of the IDTs 206A and 206C is connected to the ground potential $V_{SS}$. The other electrodes of the IDTs 206A and 206C are coupled to each other and also coupled to the dual-mode SAW filter 205.

The reception-side SAW filter 200 constructed as mentioned above is built in the branching filter 15 that is used for the radio frequency unit (RF unit) of the communication terminal as shown in FIG. 9. In other words, the input terminal 201 of the reception-side SAW filter 200 is coupled to the antenna side and the output terminal 202 is coupled to the amplifier 16 side. The flow of transmission/reception signals in the communication terminal in which the branching filter 15 comprising the reception-side SAW filter 100 constructed as mentioned above is built is similar to that of the first embodiment.

In this instance, we now pay attention to the branching filter 15. When the communication terminal transmits the transmission signal as a radio wave signal, the amplified transmission signal is generated from the power amplifier 18. Therefore, a large electric power is applied to the branching filter 15. At that time, the amplified transmission signal is directed to the reception-side SAW filter 200, so that the large electric power is also applied to the reception-side SAW filter 200 in the branching filter 15 through the input terminal 201 of the reception-side SAW filter 200.

In the reception-side SAW filter 200 according to the second embodiment of the present invention, however, in order to favorably maintain the electric power resistance of the reception-side SAW filter 200, the parallel-arm SAW resonator 204 and the serial-arm SAW resonator 203 are coupled in a ladder form to the input terminal 201. Accordingly, even if the amplified transmission signal from the power amplifier 18 is directed and inputted to the reception-side SAW filter 200, the destruction of the comb-shaped electrodes in the reception-side SAW filter 200 can be suppressed. Since the cascade-connecting dual-mode SAW filter 207 comprising the dual-mode SAW filters 205 and 206 which are cascaded is coupled to the output terminal 202 of the reception-side SAW filter 200, it is possible to increase an amount of attenuation in the vicinity of a frequency pass band regarding the reception-side SAW filter 200 in the branching filter 15, namely, in a frequency pass band regarding the transmission-side SAW filter in the branching filter 15. Also in the reception-side SAW filter 200 having the above-mentioned construction, similar to the construction of the reception-side SAW filter 100 in the first embodiment, since the number of IDTs is smaller than that of the conventional SAW filter, a degree of freedom regarding the pattern design of comb teeth electrodes can be improved and the miniaturization of the branching filter can be also realized, so that the manufacturing cost of the branching filter can be suppressed.

The SAW filter 200 having the construction shown in FIG. 2 can be used as a transmission-side SAW filter in the branching filter 15 shown in FIG. 9. That is, the input terminal 201 is coupled to the power amplifier 18 and used as an input terminal for the transmission signal amplified by the power amplifier 18. The output terminal 202 is coupled to the antenna side and used as an output terminal of the amplified transmission signal.

When the transmission signal amplified by the power amplifier 18 is inputted to the branching filter 15, a large electric power is applied to the branching filter 15. However, since the first stage of the transmission-side SAW filter, to which the amplified transmission signal is inputted, is constructed by the parallel-arm SAW resonator 204 and the serial-arm SAW resonator 203 which are coupled in a ladder form, even if an electric power caused by the amplified transmission signal is applied to the transmission-side SAW filter, the destruction of the comb-shaped electrodes in the transmission-side SAW filter can be suppressed. Since the cascade-connecting dual-mode SAW filter 207 in which the dual-mode SAW filters 205 and 206 are cascaded is coupled on the output side of the transmission-side SAW filter, it is possible to increase an amount of attenuation in the vicinity of a frequency pass band regarding the transmission-side SAW filter in the branching filter 15, namely, in a frequency pass band regarding the reception-side SAW filter in the branching filter 15.

A reception-side SAW filter 300 according to a third embodiment of the present invention will now be described with reference to FIG. 3.

Figure 3:
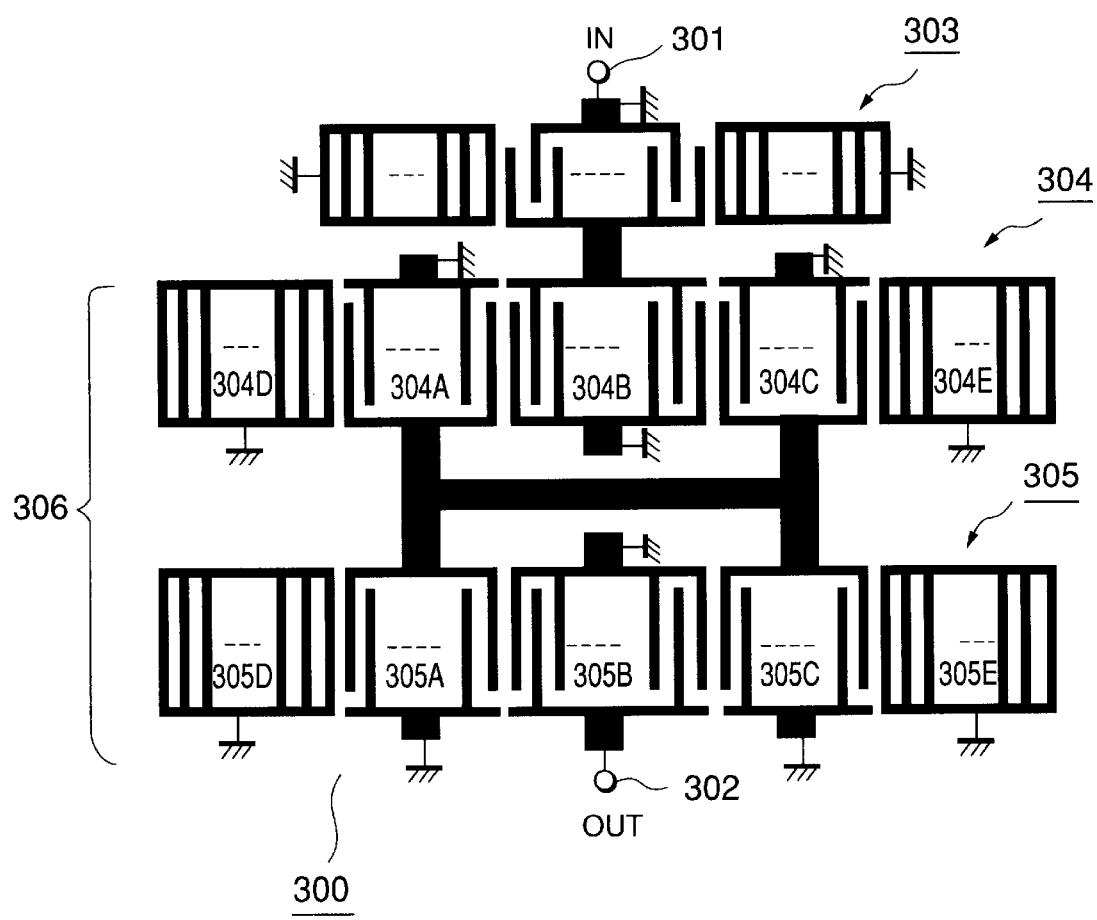
FIG. 3 is a diagram showing the construction of an SAW filter in a third embodiment of the present invention.

As shown in FIG. 3, between an input terminal 301 and an output terminal 302, a serial-arm SAW resonator 303 and a two-stage cascade-connecting dual-mode SAW filter 306 are coupled. The two-stage cascade-connecting dual-mode SAW filter 306 is constructed by cascading two dual-mode SAW filters 304 and 305. The dual-mode SAW filter 304 is constituted of three IDTs 304A to 304C and two reflectors 304D and 304E. The IDT 304B is arranged between the IDTs 304A and 304C. One comb-shaped electrode of the IDT 304B is coupled to the serial-arm SAW resonator 303. The other one of the IDT 304B is coupled to the ground potential $V_{SS}$. One electrode of each of the IDTs 304A and 304C is connected to the ground potential $V_{SS}$. The other electrodes of the IDTs 304A and 304C are coupled to each other and also coupled to the dual-mode SAW filter 305. The dual-mode SAW filter 305 also comprises three IDTs 305A to 305C and two reflectors 305D and 305E. The IDT 305B is arranged between the IDTs 305A and 305C. One comb-shaped electrode of the IDT 305B is coupled to the ground potential $V_{SS}$ and the other one of the IDT 305B is coupled to the output terminal 302. One electrode of each of the IDTs 305A and 305C is coupled to the ground potential $V_{SS}$. The other electrodes of the IDTs 305A and 305C are coupled to each other and also coupled to the dual-mode SAW filter 304.

The reception-side SAW filter 300 constructed as mentioned above is built in the branching filter 15 that is used for the radio frequency unit (RF unit) of the communication terminal as shown in FIG. 9. In other words, the input terminal 301 of the reception-side SAW filter 300 is coupled to the antenna side and the output terminal 302 is coupled to the amplifier 16 side. The flow of transmission/reception signals in the communication terminal in which the branching filter 15 comprising the reception-side SAW filter 300 constructed as mentioned above is built is similar to those of the first and second embodiments.

In this instance, we now pay attention to the branching filter 15. When the communication terminal transmits a transmission signal as a radio wave signal, an amplified transmission signal is generated from the power amplifier 18. Therefore, a large electric power is applied to the branching filter 15. At that time, the amplified transmission signal is directed to the reception-side SAW filter 300, so that the large electric power is also applied to the reception-side SAW filter 300 in the branching filter 15 through the input terminal 301 of the reception-side SAW filter 300.

In the reception-side SAW filter 300 according to the third embodiment of the present invention, however, in order to preferably maintain the electric power resistance of the reception-side SAW filter 300, the one serial-arm SAW resonator 303 is coupled to the input terminal 301. Accordingly, even if the amplified transmission signal from the power amplifier 18 is directed and inputted to the reception-side SAW filter 300, the destruction of the comb-shaped electrodes in the reception-side SAW filter 300 can be suppressed. Since the cascade-connecting dual-mode SAW filter 306 comprising the dual-mode SAW filters 304 and 305 which are cascaded is coupled to the output terminal 302 of the reception-side SAW filter 300, it is possible to increase an amount of attenuation in the vicinity of a frequency pass band regarding the reception-side SAW filter 300 in the branching filter 15, namely, in a frequency pass band regarding the transmission-side SAW filter in the branching filter 15. Also in the reception-side SAW filter 300 having the above-mentioned construction, similar to the constructions of the reception-side SAW filters 100 and 200 in the first and second embodiments, since the number of IDTs is smaller than that of the conventional SAW filter, a degree of freedom regarding the pattern design of comb teeth electrodes can be improved and the miniaturization of the branching filter can be also realized, so that the manufacturing cost of the branching filter can be suppressed.

The SAW filter 300 having the construction shown in FIG. 3 can also be used as a transmission-side SAW filter in the branching filter 15 shown in FIG. 9. In other words, the input terminal 301 is coupled to the power amplifier 18 and used as an input terminal for the transmission signal amplified by the power amplifier 18. The output terminal 302 is coupled to the antenna side and used as an output terminal of the amplified transmission signal.

When the transmission signal amplified by the power amplifier 18 is inputted to the branching filter 15, a large electric power is applied to the branching filter 15. However, since the first stage of the transmission-side SAW filter, to which the amplified transmission signal is inputted, is constructed by the serial-arm SAW resonator 303, even if an electric power caused by the amplified transmission signal is applied to the transmission-side SAW filter, the destruction of the comb-shaped electrodes in the transmission-side SAW filter can be suppressed. Since the cascade-connecting dual-mode SAW filter 306 in which the dual-mode SAW filters 304 and 305 are cascaded is coupled on the output side of the transmission-side SAW filter, it is possible to increase an amount of attenuation in the vicinity of a frequency pass band regarding the transmission-side SAW filter in the branching filter 15, namely, in a frequency pass band regarding the reception-side SAW filter in the branching filter 15.

An SAW filter 400 according to a fourth embodiment of the present invention will now be described with reference to FIG. 4. The SAW filter 400 is also applicable to both of the transmission filter and the reception filter in the branching filter.

Figure 4:
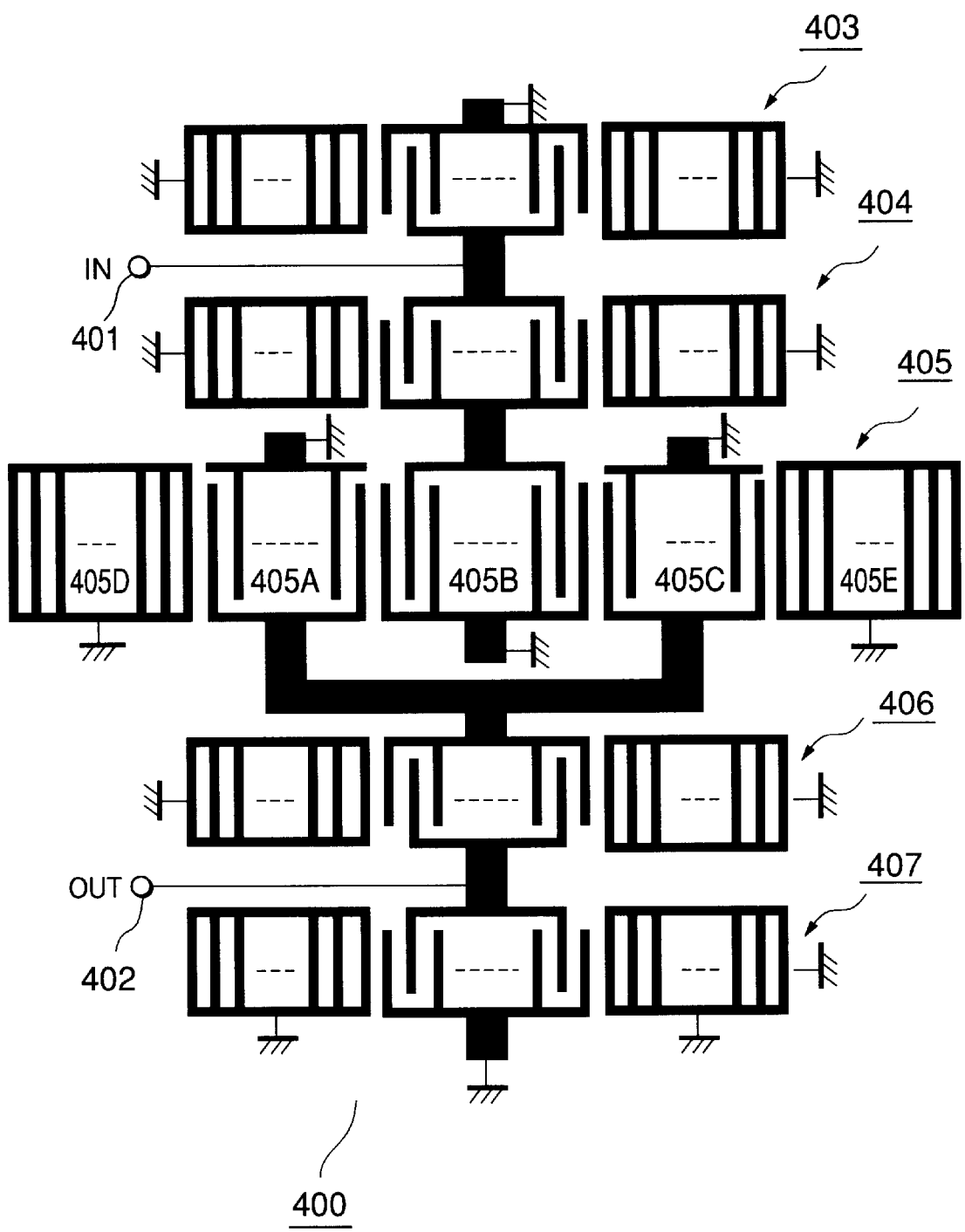
FIG. 4 is a diagram showing the construction of an SAW filter in a fourth embodiment of the present invention.

As shown in FIG. 4, between an input terminal 401 and an output terminal 402, a serial-arm SAW resonator 404, a one-stage cascade-connecting dual-mode SAW filter 405, and a serial-arm SAW resonator 406 are coupled. A parallel-arm SAW resonator 403 is coupled between the input terminal 401 and the ground potential $V_{SS}$. A parallel-arm SAW resonator 407 is coupled between the output terminal 402 and the ground potential. The one-stage cascade-connecting dual-mode SAW filter 405 is constituted of three IDTs 405A to 405C and two reflectors 405D and 405E. The IDT 405B is arranged between the IDTs 405A and 405C. One comb-shaped electrode of the IDT 405B is coupled to the serial-arm SAW resonator 404. The other one of the IDT 405B is coupled to the ground potential $V_{SS}$. One electrode of each of the IDTs 405A and 405C is connected to the ground potential $V_{SS}$. The other electrodes of the IDTs 405A and 405C are coupled to each other and also coupled to the serial-arm SAW resonator 406.

The SAW filter 400 constructed as mentioned above is built as a transmission-side SAW filter and a reception-side SAW filter in the branching filter 15 which is used for the radio frequency unit (RF unit) of the communication terminal as shown in FIG. 9. In other words, when the SAW filter 400 is built as a reception-side SAW filter in the branching filter 15, the input terminal 401 is coupled to the antenna side and the output terminal 402, is coupled to the amplifier 16 side. On the other hand, when the SAW filter 400 is built as a transmission-side SAW filter in the branching filter 15, the input terminal 401 is coupled to the power amplifier 18 and the output terminal 402 is coupled to the antenna side.

The flow of transmission/reception signals in the communication terminal in which the branching filter 15 comprising the transmission-side and reception-side SAW filter constructed as mentioned above is built is similar to those of the above-described first to third embodiments.

In this instance, we now pay attention to the branching filter 15 and consider the case where the communication terminal transmits a transmission signal as a radio wave signal. A transmission signal amplified by the power amplifier 18 is generated as a radio wave signal from the antenna through the transmission-side SAW filter. At that time, the amplified transmission signal is also directed and inputted to the reception-side SAW filter. That is, in the branching filter 15, the amplified transmission signal is inputted not only to the transmission-side SAW filter but also to the reception side SAW filter. Therefore, a large electric power is applied to both of the transmission-side and reception-side SAW filters.

In the SAW filter 400 which is used as a transmission-side and reception-side SAW filter according to the fourth embodiment of the present invention, however, in order to preferably maintain the electric power resistance of the reception-side SAW filter 400, the parallel-arm SAW resonator 403 and the serial-arm SAW resonator 404 constructed in a ladder form are coupled to the input terminal 401. Accordingly, even if the amplified transmission signal from the power amplifier 18 is inputted to the transmission-side and reception-side SAW filter, such a possibility that the comb-shaped electrodes in the SAW filter are broken is reduced.

Since the cascade-connecting dual-mode SAW filter 405 is coupled after the first stage of the SAW filter 400 that is used as a transmission-side and reception-side SAW filter, in the transmission-side filter and reception-side filter in the branching filter 15, it is possible to increase an amount of attenuation in the vicinity of each of frequency pass bands of both the filters, namely, both of the attenuation amount of the reception-side filter in the frequency pass band regarding the transmission-side SAW filter 300 in the branching filter 15 and the attenuation amount of the transmission-side filter in the frequency pass band regarding the reception-side filter.

Further, also in the SAW filter 400 having the above-mentioned construction, similar to the constructions of the SAW filters in the first to third embodiments, since the number of IDTs is smaller than that of the conventional SAW filter, a degree of freedom regarding the pattern design of the comb teeth electrodes can be improved and the miniaturization of the branching filter can be also realized, so that the manufacturing cost of the branching filter can be suppressed.

An SAW filter 500 according to a fifth embodiment of the present invention will now be described with reference to FIG. 5. The SAW filter 500 is also applicable to both of the transmission filter and the reception filter in the branching filter.

Figure 5:
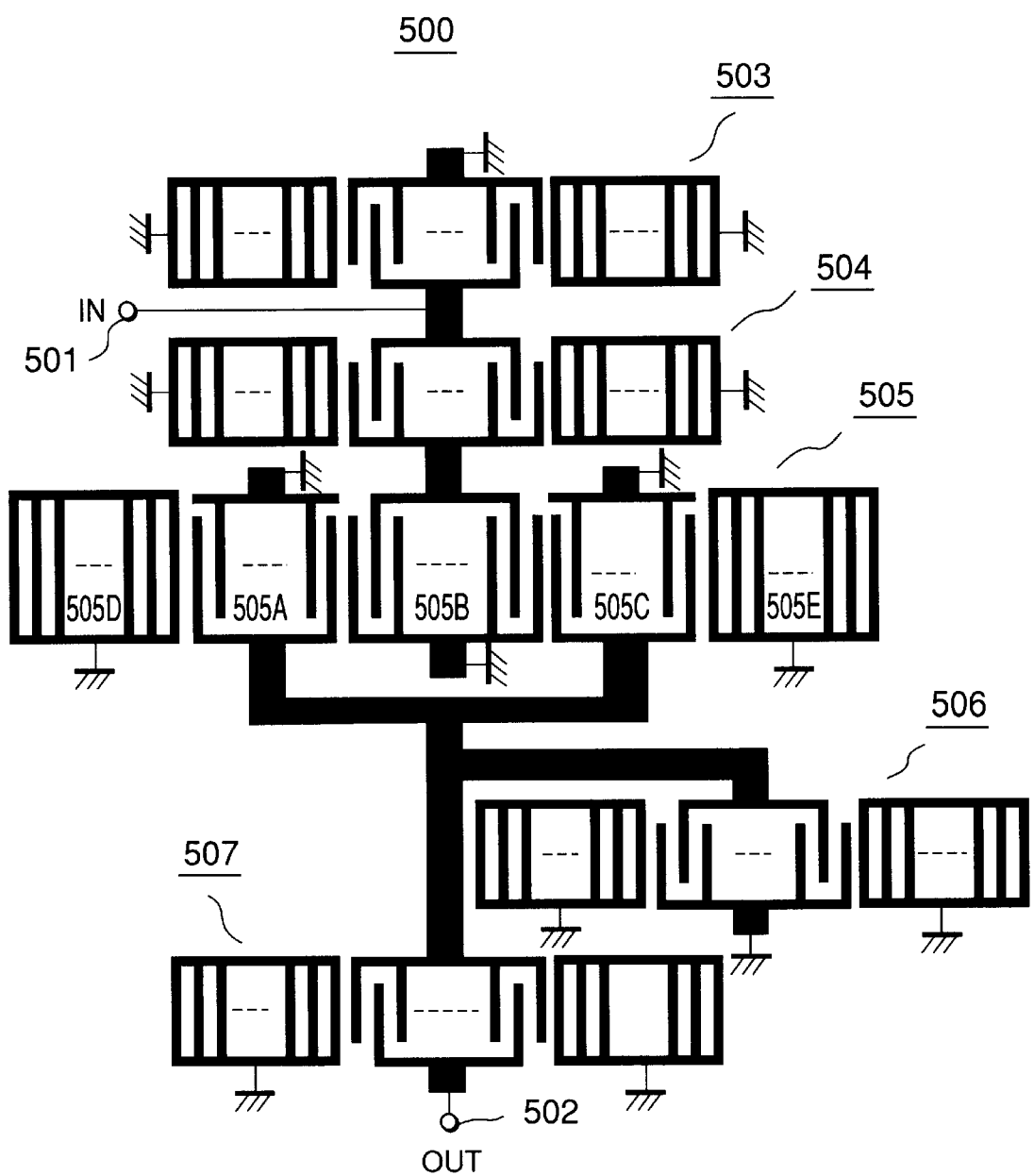
FIG. 5 is a diagram showing the construction of an SAW filter in a fifth embodiment of the present invention.

As shown in FIG. 5, between an input terminal 501 and an output terminal 502, a serial-arm SAW resonator 504, a one-stage cascade-connecting dual-mode SAW filter 505, and a serial-arm SAW resonator 507 are coupled. A parallel-arm SAW resonator 503 is coupled between the input terminal 501 and the ground potential $V_{SS}$. A parallel-arm SAW resonator 506 is coupled between the one-stage cascade-connecting dual-mode SAW filter 505, serial-arm SAW resonator 507, and ground potential $V_{SS}$. The one-stage cascade-connecting dual-mode SAW filter 505 comprises three IDTs 505A to 505C and two reflectors 505D and 505E. The IDT 505B is arranged between the IDTs 505A and 505C. One comb-shaped electrode of the IDT 505B is coupled to the serial-arm SAW resonator 504. The other one of the IDT 505B is coupled to the ground potential $V_{SS}$. One electrode of each of the IDTs 505A and 505C is connected to the ground potential $V_{SS}$. The other electrodes of the IDTs 505A and 505C are coupled to each other and also coupled to the parallel-arm SAW resonator 506 and the serial-arm SAW resonator 507.

The SAW filter 500 constructed as mentioned above is built as a transmission-side SAW filter and a reception-side SAW filter in the branching filter 15 which is used for the radio frequency unit (RF unit) of the communication terminal as shown in FIG. 9. In other words, when the SAW filter 500 is built as a reception-side SAW filter in the branching filter 15, the input terminal 501 is coupled to the antenna side and the output terminal 502 is coupled to the amplifier 16 side. On the other hand, when the SAW filter 500 is built as a transmission-side SAW filter in the branching filter 15, the input terminal 501 is coupled to the power amplifier 18 and the output terminal 502 is coupled to the antenna side.

The flow of transmission/reception signals in the communication terminal in which the branching filter 15 comprising the transmission-side and reception-side SAW filter constructed as mentioned above is built is similar to those of the above-described first to fourth embodiments.

In this instance, we now pay attention to the branching filter 15 and consider the case where the communication terminal transmits a transmission signal as a radio wave signal. A transmission signal amplified by the power amplifier 18 is generated as a radio wave signal from the antenna through the transmission-side SAW filter. At that time, the amplified transmission signal is also directed and inputted to the reception-side SAW filter. In other words, in the branching filter 15, the amplified transmission signal is inputted not only to the transmission-side SAW filter but also to the reception-side SAW filter. Accordingly, a large electric power is applied to both of the transmission-side and reception-side SAW filters.

In the SAW filter 500 which is used as a transmission-side and reception-side SAW filter according to the fifth embodiment of the present invention, however, in order to favorably maintain the electric power resistance of the SAW filter 500, the parallel-arm SAW resonator 503 and the serial-arm SAW resonator 504 constructed in a ladder form are coupled to the input terminal 501. Accordingly, even if the amplified transmission signal from the power amplifier 18 is inputted to the transmission-side and reception-side SAW filter, such a possibility that the comb-shaped electrodes in the SAW filter are broken is reduced.

Since the cascade-connecting dual-mode SAW filter 505 is coupled after the first stage of the SAW filter 500 which is used as a transmission-side and reception-side SAW filter, in the transmission-side filter and the reception-side filter in the branching filter 15, it is possible to increase an amount of attenuation in the vicinity of each of frequency pass bands of both the filters, namely, both of the attenuation amount of the reception-side filter in the frequency pass band regarding the transmission-side filter in the branching filter 15 and the attenuation amount of the transmission-side filter in the frequency pass band regarding the reception-side filter.

Further, also in the SAW filter 500 having the above-mentioned construction, similar to the SAW filters of the first to fourth embodiments, the number of IDTs is smaller than that of the conventional SAW filter. Accordingly, a degree of freedom regarding the pattern design of the comb teeth electrodes can be improved and the miniaturization of the branching filter can be also realized, so that the manufacturing cost of the branching filter can be suppressed.

An SAW filter 600 according to a sixth embodiment of the present invention will now be described with reference to FIG. 6. The SAW filter 600 is also applicable to both of the transmission filter and the reception filter in the branching filter.

Figure 6:
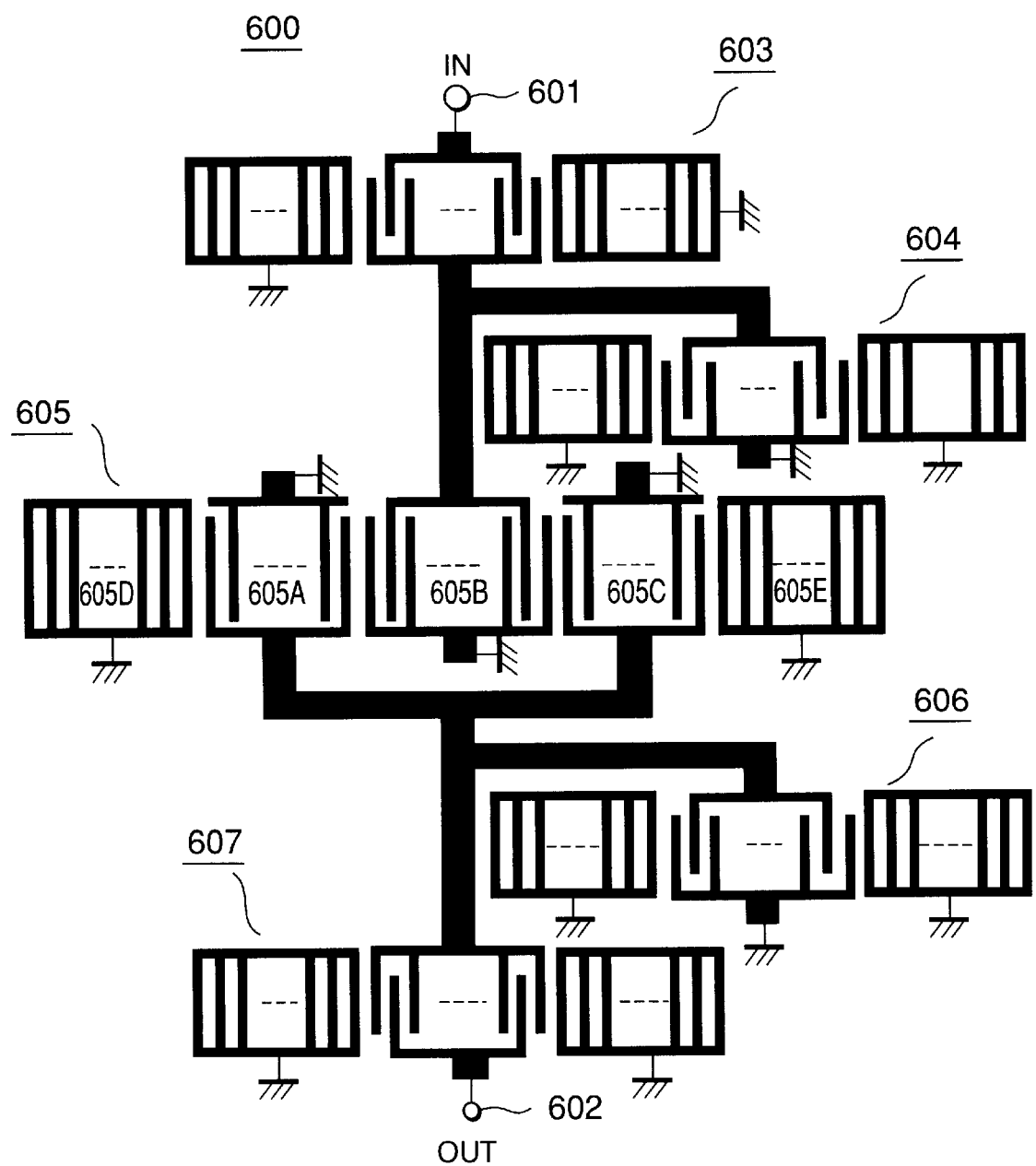
FIG. 6 is a diagram showing the construction of an SAW filter in a sixth embodiment of the present invention.

As shown in FIG. 6, between an input terminal 601 and an output terminal 602, a serial-arm SAW resonator 603, a one-stage cascade-connecting dual-mode SAW filter 605, and a serial-arm SAW resonator 607 are coupled. A parallel-arm SAW resonator 604 is coupled between the serial-arm SAW resonator 603, cascade-connecting dual-mode SAW filter 605, and ground potential $V_{SS}$. On the other hand, a parallel-arm SAW resonator 606 is coupled between the cascade-connecting dual-mode SAW filter 605, serial-arm SAW resonator 607, and ground potential $V_{SS}$. The one-stage cascade-connecting dual-mode SAW filter 605 is constituted of three IDTs 605A to 605C and two reflectors 605D and 605E. The IDT 605B is arranged between the IDTs 605A and 605C. One comb-shaped electrode of the IDT 605B is coupled to the serial-arm SAW resonator 603 and the parallel-arm SAW resonator 604. The other one of the IDT 605B is coupled to the ground potential $V_{SS}$. One electrode of each of the IDTs 605A and 605C is coupled to the ground potential $V_{SS}$. The other electrodes of the IDTs 605A and 605C are coupled to each other and also coupled to the parallel-arm SAW resonator 606 and the serial-arm SAW resonator 607.

The SAW filter 600 constructed as mentioned above is built as a transmission-side SAW filter and a reception-side SAW filter in the branching filter 15 which is used for the radio frequency unit (RF unit) of the communication terminal as shown in FIG. 9. In other words, when the SAW filter 600 is built as a reception-side SAW filter in the branching filter 15, the input terminal 601 is coupled to the antenna side and the output terminal 602 is coupled to the amplifier 16 side. On the other hand, when the SAW filter 600 is built as a transmission-side SAW filter in the branching filter 15, the input terminal 601 is coupled to the power amplifier 18 and the output terminal 602 is coupled to the antenna side.

The flow of transmission/reception signals in the communication terminal in which the branching filter 15 comprising the transmission-side and reception-side SAW filter constructed as mentioned above is built is similar to those of the above-described first to fifth embodiments.

In this instance, we now pay attention to the branching filter 15 and consider the case where the communication terminal transmits a transmission signal as a radio wave signal. A transmission signal amplified by the power amplifier 18 is generated as a radio wave signal from the antenna through the transmission-side SAW filter. At that time, the amplified transmission signal is also directed and inputted to the reception-side SAW filter. In other words, in the branching filter 15, the amplified transmission signal is inputted not only to the transmission-side SAW filter but also to the reception-side SAW filter. Accordingly, a large electric power is applied to both of the transmission-side and reception-side SAW filters.

In the SAW filter 600 which is used as a transmission-side and reception-side SAW filter according to the sixth embodiment of the present invention, however, in order to preferably maintain the electric power resistance of the SAW filter 600, the serial-arm SAW resonator 603 and the parallel-arm SAW resonator 604 which are constructed in a ladder form are coupled to the input terminal 601. Accordingly, even if the amplified transmission signal from the power amplifier 18 is inputted to the transmission-side and reception-side SAW filter, such a possibility that the comb-shaped electrodes in the SAW filter are broken is reduced.

Since the cascade-connecting dual-mode SAW filter 605 is coupled after the first stage of the SAW filter 600 which is used as a transmission-side and reception-side SAW filter, in the transmission-side filter and the reception-side filter in the branching filter 15, it is possible to increase an amount of attenuation in the vicinity of each of frequency pass bands of both the filters, namely, both the attenuation amount of the reception-side filter in the frequency pass band regarding the transmission-side filter in the branching filter 15 and the attenuation amount of the transmission-side filter in the frequency pass band regarding the reception-side filter.

Further, also in the SAW filter 600 having the above-mentioned construction, similar to the SAW filters of the first to fifth embodiments, the number of IDTs is smaller than that of the conventional SAW filter. Accordingly, a degree of freedom regarding the pattern design of the comb teeth electrodes can be improved and the miniaturization of the branching filter can be also realized, so that the manufacturing cost of the branching filter can be suppressed.

An SAW filter 700 according to a seventh embodiment of the present invention will now be described with reference to FIG. 7. The SAW filter 700 is also applicable to both of the transmission filter and the reception filter in the branching filter.

Figure 7:
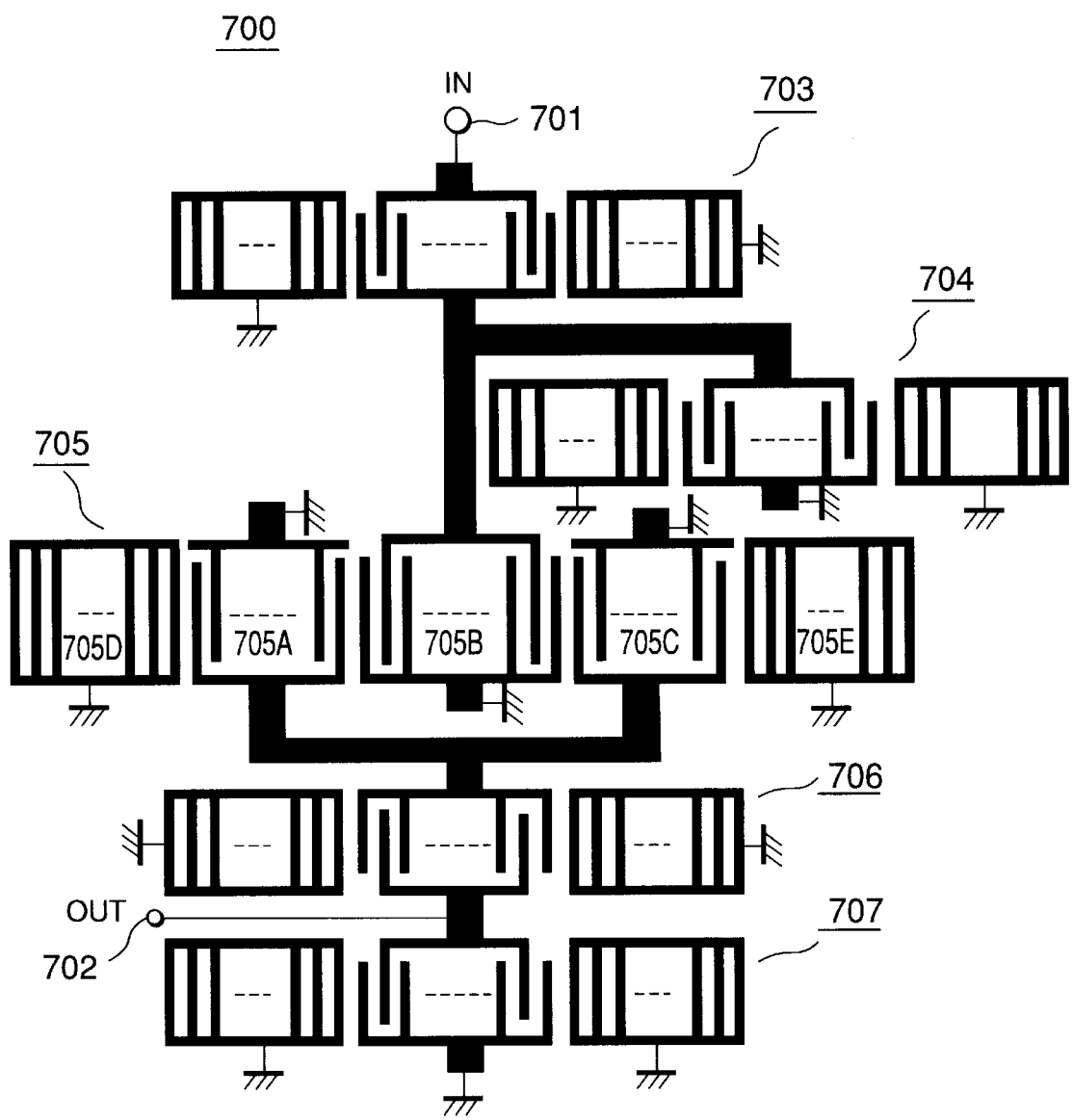
FIG. 7 is a diagram showing the construction of an SAW filter in a seventh embodiment of the present invention.
Figure 8:
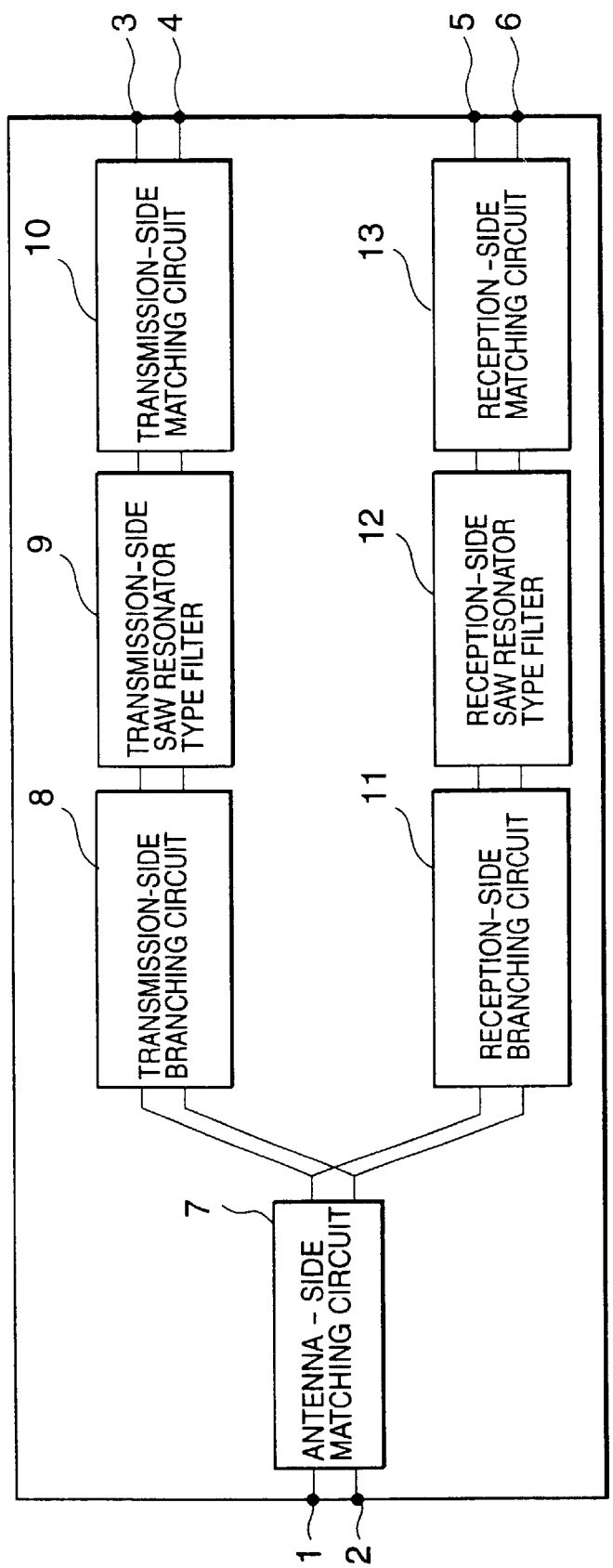
FIG. 8 is a diagram showing the construction of a branching filter comprising conventional SAW filters.

As shown in FIG. 7, between an input terminal 701 and an output terminal 702, a serial-arm SAW resonator 703, a one-stage cascade-connecting dual-mode SAW filter 705, and a serial-arm SAW resonator 706 are coupled. A parallel-arm SAW resonator 704 is coupled between the serial-arm SAW resonator 703, cascade-connecting dual-mode SAW filter 705, and ground potential $V_{SS}$. On the other hand, a parallel-arm SAW resonator 707 is coupled between the output terminal 702 and the ground potential $V_{SS}$.

The one-stage cascade-connecting dual-mode SAW filter 705 comprises three IDTs 705A to 705C and two reflectors 705D and 705E. The IDT 705B is arranged between the IDTs 705A and 705C. One comb-shaped electrode of the IDT 705B is coupled to the serial-arm SAW resonator 703 and the parallel-arm SAW resonator 704. The other one of the IDT 705B is coupled to the ground potential $V_{SS}$. One electrode of each of the IDTs 705A and 705C is connected to the ground potential $V_{SS}$. The other electrodes of the IDTs 705A and 705C are coupled to each other and also coupled to the serial-arm SAW resonator 706.

The SAW filter 700 constructed as mentioned above is built as a transmission-side SAW filter and a reception-side SAW filter in the branching filter 15 which is used for the radio frequency unit (RF unit) of the communication terminal as shown in FIG. 9. In other words, when the SAW filter 700 is built as a reception-side SAW filter in the branching filter 15, the input terminal 701 is coupled to the antenna side and the output terminal 702 is coupled to the amplifier 16 side. On the other hand, when the SAW filter 700 is built as a transmission-side SAW filter in the branching filter 15, the input terminal 701 is coupled to the power amplifier 18 and the output terminal 702 is coupled to the antenna side.

The flow of transmission/reception signals in the communication terminal in which the branching filter 15 comprising the transmission-side and reception-side SAW filter constructed as mentioned above is built is similar to those of the above-described first to sixth embodiments.

In this instance, we now pay attention to the branching filter 15 and consider the case where the communication terminal transmits a transmission signal as a radio wave signal. A transmission signal amplified by the power amplifier 18 is generated as a radio wave signal from the antenna through the transmission-side SAW filter. At that time, the amplified transmission signal is also directed and inputted to the reception-side SAW filter. In other words, in the branching filter 15, the amplified transmission signal is inputted not only to the transmission-side SAW filter but also to the reception-side SAW filter. Accordingly, a large electric power is applied to both of the transmission-side and reception-side SAW filters.

In the SAW filter 700 which is used as a transmission-side and reception-side SAW filter according to the seventh embodiment of the present invention, however, in order to preferably maintain the electric power resistance of the SAW filter 700, the serial-arm SAW resonator 703 and the parallel-arm SAW resonator 704 which are constructed in a ladder form are coupled to the input terminal 701. Accordingly, even if the amplified transmission signal from the power amplifier 18 is inputted to the transmission-side and reception-side SAW filter, such a possibility that the comb-shaped electrodes in the SAW filter are broken is reduced.

Since the cascade-connecting dual-mode SAW filter 705 is coupled after the first stage of the SAW filter 700 which is used as a transmission-side and reception-side SAW filter, in the transmission-side filter and the reception-side filter in the branching filter 15, it is possible to increase an amount of attenuation in the vicinity of each of frequency pass bands of both the filters, namely, both the attenuation amount of the reception-side filter in the frequency pass band regarding the transmission-side filter in the branching filter 15 and the attenuation amount of the transmission-side filter in the frequency pass band regarding the reception-side filter.

Further, also in the SAW filter 700 having the above-mentioned construction, similar to the SAW filters of the first to sixth embodiments, the number of IDTs is smaller than that of the conventional SAW filter. Accordingly, a degree of freedom regarding the pattern design of the comb teeth electrodes can be improved and the miniaturization of the branching filter can be also realized, so that the manufacturing cost of the branching filter can be suppressed.

What is claimed is:

1. A surface acoustic wave filter comprising:
   a first serial-arm SAW resonator coupled to an input terminal;
   a first dual-mode SAW resonator coupled between said first serial-arm SAW resonator and an output terminal, wherein
      said first dual-mode SAW resonator includes first to third comb-shaped interdigital transducers,
      said second comb-shaped interdigital transducer is arranged between said first interdigital transducer and said third interdigital transducer and also coupled between the first serial-arm SAW resonator and the ground potential, and
      each of the first and third comb-shaped interdigital transducers is coupled between said ground potential and said output terminal; and
   a second dual-mode SAW resonator coupled between said first dual-mode SAW resonator and said output terminal.

2. The filter according to claim 1, further comprising
   a first parallel-arm SAW resonator coupled between said first serial-arm SAW resonator and the ground potential.

3. The filter according to claim 2, further including:
   a second serial-arm SAW resonator coupled between said first dual-mode SAW resonator and the output terminal; and
   a second parallel-arm SAW resonator coupled between the first dual-mode SAW resonator and the ground potential.

4. The filter according to claim 3, wherein
   said first and third comb-shaped interdigital transducers are coupled to said second serial-arm SAW resonator and said second parallel-arm SAW resonator.

5. The filter according to claim 1, further comprising
   a first parallel-arm SAW resonator coupled between the input terminal and the ground potential.

6. The filter according to claim 5 further comprising:
   a second serial-arm SAW resonator coupled between said first dual-mode SAW resonator and the output terminal; and
   a second parallel-arm SAW resonator coupled between the output terminal and the ground potential.

7. The filter according to claim 6, wherein the first and third comb-shaped interdigital transducers are coupled to said second serial-arm SAW resonator.

8. The filter according to claim 1, wherein both of said first and third comb-shaped interdigital transducers are coupled to said second dual-mode SAW resonator and the ground potential,
   the second dual-mode SAW resonator has fourth to sixth comb-shaped interdigital transducers,
   said fifth comb-shaped interdigital transducer is arranged between said fourth comb-shaped interdigital transducer and said sixth comb-shaped interdigital transducer and also coupled between the output terminal and the ground potential, and each of the fourth and sixth comb-shaped interdigital transducers is coupled between the first dual-mode SAW resonator and the ground potential.

9. The filter according to claim 8, wherein
   said first, third, fourth, and sixth comb-shaped interdigital transducers are coupled to each other.

10. A surface acoustic wave branching filter comprising:
    a reception-side surface acoustic wave filter which is coupled between an antenna terminal and an amplifier; and
    a transmission-side surface acoustic wave filter which is coupled between said antenna terminal and a power amplifier, wherein
       an input terminal of said reception-side surface acoustic wave filter is coupled to the antenna terminal and an output terminal of said reception-side surface acoustic wave filter is coupled to said amplifier,
       the reception-side surface acoustic wave filter has
       a first serial-arm SAW resonator coupled to the input terminal and
       a first dual-mode SAW resonator coupled between said first serial-arm SAW resonator and the output terminal,
       the first dual-mode SAW resonator includes first to third comb-shaped interdigital transducers,
       said second comb-shaped interdigital transducer is arranged between said first comb-shaped interdigital transducer and third comb-shaped interdigital transducer and also coupled between the first serial-arm SAW resonator and the ground potential, and each of the first and third comb-shaped interdigital transducers is coupled between the ground potential and the output terminal a second dual-mode SAW resonator coupled between said first dual-mode SAW resonator and the output terminal.

11. The filter according to claim 10, further comprising a first parallel-arm SAW resonator coupled between said first serial-arm SAW resonator and the ground potential.

12. The filter-according to claim 11, further including:
a second serial-arm SAW resonator coupled between said first dual-mode SAW resonator and the output terminal; and
a second parallel-arm SAW resonator coupled between the first dual-mode SAW resonator and the ground potential.

13. The filter according to claim 12, wherein said first and third comb-shaped interdigital transducers are coupled to said second serial-arm SAW resonator and said second parallel-arm SAW resonator.

14. The filter according to claim 10, further comprising a first parallel-arm SAW resonator coupled between the input terminal and the ground potential.

15. The filter according to claim 14, further comprising:
a second serial-arm SAW resonator coupled between said first dual-mode SAW resonator and the output terminal; and
a second parallel-arm SAW resonator coupled between the output terminal and the ground potential.

16. The filter according to claim 15, wherein the first and third comb-shaped interdigital transducers are coupled to said second serial-arm SAW resonator.

17. The filter according to claim 10, wherein
both of said first and third comb-shaped interdigital transducers are coupled to said second dual-mode SAW resonator and the ground potential,
the second dual-mode SAW resonator has fourth to sixth comb-shaped interdigital transducers,
said fifth comb-shaped interdigital transducer is arranged between said fourth comb-shaped interdigital transducer and said sixth comb-shaped interdigital transducer and also coupled between the output terminal and the ground potential, and
each of the fourth and sixth comb-shaped interdigital transducers is coupled between the first dual-mode SAW resonator and the ground potential.

18. The filter according to claim 17, wherein said first, third, fourth, and sixth comb-shaped interdigital transducers are coupled to each other.

19. A surface acoustic wave filter comprising:
a first serial-arm SAW resonator coupled to an input terminal;
a first parallel-arm SAW resonator coupled between the input terminal and a ground potential;
a first dual-mode SAW resonator coupled between the first serial-arm SAW resonator and an output terminal,
wherein said first dual-mode SAW resonator includes first to third comb-shaped interdigital transducers,
said second comb-shaped interdigital transducer is arranged between said first interdigital transducer and said third interdigital transducer and also coupled between the first serial-arm SAW resonator and the ground potential, and
each of the first and third comb-shaped interdigital transducers is coupled between said ground potential and said output terminal;
a second serial-arm SAW resonator coupled to said first dual-mode SAW resonator and the output terminal; and
a second parallel-arm SAW resonator coupled between the output terminal and the ground potential; and
at least one of a first node shared by the input terminal, the first serial-arm SAW resonator, and the first parallel-arm SAW and a second node shared by the output terminal, the second serial-arm SAW resonator, and the second parallel-arm SAW resonator.

20. The filter according to claim 19, wherein the filter comprises both the first node and the second node.

* * * * *